US011570928B2

(12) United States Patent
Sri-Jayantha et al.

(10) Patent No.: US 11,570,928 B2
(45) Date of Patent: Jan. 31, 2023

(54) SERVER NODE CONNECTOR MATING CONDITION HEALTH MONITORING AND REPORTING

(71) Applicant: international Business Machines Corporation, Armonk, NY (US)

(72) Inventors: Sri M Sri-Jayantha, Ossining, NY (US); Hien P Dang, Nanuet, NY (US); Vijayeshwar D Khanna, Millwood, NY (US)

(73) Assignee: International Business Machines Corporation, Armonk, NY (US)

( * ) Notice: Subject to any disclaimer, the term of this patent is extended or adjusted under 35 U.S.C. 154(b) by 369 days.

(21) Appl. No.: 17/000,299

(22) Filed: Aug. 22, 2020

(65) Prior Publication Data
US 2020/0389994 A1 Dec. 10, 2020

Related U.S. Application Data

(62) Division of application No. 16/179,983, filed on Nov. 4, 2018, now Pat. No. 10,834,844.

(51) Int. Cl.
*H05K 7/14* (2006.01)
*G08B 21/18* (2006.01)
(Continued)

(52) U.S. Cl.
CPC ........... *H05K 7/1498* (2013.01); *G01B 21/16* (2013.01); *G01B 21/22* (2013.01); *G01R 31/67* (2020.01);
(Continued)

(58) Field of Classification Search
CPC ............... H05K 7/1498; H05K 7/1452; H05K 7/1492; G01R 31/67; G08B 21/182; H01R 25/006; G01B 21/22; G01B 21/16
See application file for complete search history.

(56) References Cited

U.S. PATENT DOCUMENTS

| 7,321,313 B1 * | 1/2008 | Inlow | H01R 13/641 340/687 |
| 7,914,319 B2 * | 3/2011 | Jones | H01R 13/641 439/490 |

(Continued)

FOREIGN PATENT DOCUMENTS

EP 2661162 A3 5/2017

OTHER PUBLICATIONS

Smart Connector Technology RIT Smart Connector technology emerged from this collaborative effort, Research at RIT, The Rochester Institute of Technology Research Report, Spring/Summer 2008, p. 19.

(Continued)

*Primary Examiner* — Alvaro E Fortich
*Assistant Examiner* — Zannatul Ferdous
(74) *Attorney, Agent, or Firm* — Daniel P. Morris; Erik Johnson; Lou Percello, Attorney, PLLC (57) ABSTRACT

A server node connection system uses two or more proximity sensors per server node to determine progressive, real time changes in wipe length for each individual connector on the node that is connected to an opposing header connector on header connected to a midplane of the server assembly/rack. The system is capable of scanning, monitoring, trending, and alarming.

19 Claims, 7 Drawing Sheets

(51) Int. Cl.
*H01R 25/00* (2006.01)
*G01B 21/22* (2006.01)
*G01B 21/16* (2006.01)
*G01R 31/67* (2020.01)

(52) U.S. Cl.
CPC ......... *G08B 21/182* (2013.01); *H01R 25/006* (2013.01)

(56) References Cited

U.S. PATENT DOCUMENTS

| | | |
|---|---|---|
| 9,747,182 B2* | 8/2017 | Thornley ............ G06F 11/3692 |
| 2009/0215285 A1 | 8/2009 | Creasy et al. |
| 2013/0017732 A1 | 1/2013 | Parke |
| 2017/0244198 A1 | 8/2017 | Wanner |

OTHER PUBLICATIONS

Appendix P.
Notice of References by Examiner.

\* cited by examiner

Figure 7 even further than 120 degrees.
SERVER NODE CONNECTOR MATING CONDITION HEALTH MONITORING AND REPORTING This application is a Division of U.S. patent application Ser. No. 16/179,983 to Sri-Jayantha et al. filed on Nov. 4, 2018.

BACKGROUND

A new generation of high-performance servers are made to be field hot-pluggable and removable systems. A typical server node may occupy one of eight sever slots provided by a tall rack system. A fully populated rack with eight server nodes each weighing about 120 pounds can produce significant deformation of the rack assembly and associated electronic cards (also called midplane) facilitating inter-node communications. Each sever node communicates with external devices through a large pin-count connector. A modern connector may have 14×120 pin-outs covering a 20×200 mm wide surface. Maintaining robust contact between the stationary connector on the mid-plane and moveable connector on the node has become a challenge. The plug-in process has to guarantee less than 100 um loss in electrical wipe length. Due to mechanical interaction and manufacturing tolerances electrical contact (wipe) loss as much as 450 um has been found in server systems. It is important to avoid field failure of functional server nodes due to poor connector mating condition.

SUMMARY

Preferred embodiments of the present invention include: a novel server node, a server node connection system, and methods of operation, monitoring, alarm, and use of the server nodes and/or the server node connection system.

A server node connection system is resident on one or more server assemblies or server racks. In typical configurations the server racks house one to eight server nodes. Each of the server nodes has one or more central processing units; one or more memories; a connector side, with at least one connector receptacle; and back side opposite to the connector side. The connector receptacle is removable and has a plurality of connectors where each of the connectors has a connector length along an engagement direction. During operation, a wipe length on the connector length for each of one or more of the connectors is in physical and electrical contact with an opposing header connector on header connected to a midplane of the server assembly/rack. Continuous gap signals from two or more proximity sensors represent gap distances and progressive changes in gap distances between connector receptacle and one or more references. Using the gap signals, a process determines the wipe lengths of one or more pairs of connectors on the connector receptacle and the respective opposing header connection. The system and method are capable of monitoring and reporting the wipe lengths and determining and/or sending an alarm if the wipe lengths fall out of a tolerance.

DETAILED DESCRIPTION

By deploying an array of two or more gap sensors for each of one or more server nodes connected to the mid-plane connector, the gap signal information is continuously monitored and processed by a processor unit. The processing unit determines the gap condition and checks it against a pre-set criteria for connector wipe-induced failure. The health condition of the connector mating status is immediately displayed to a field operator as well as transmitted through internet protocol to a remote observer.

Figure 1A:
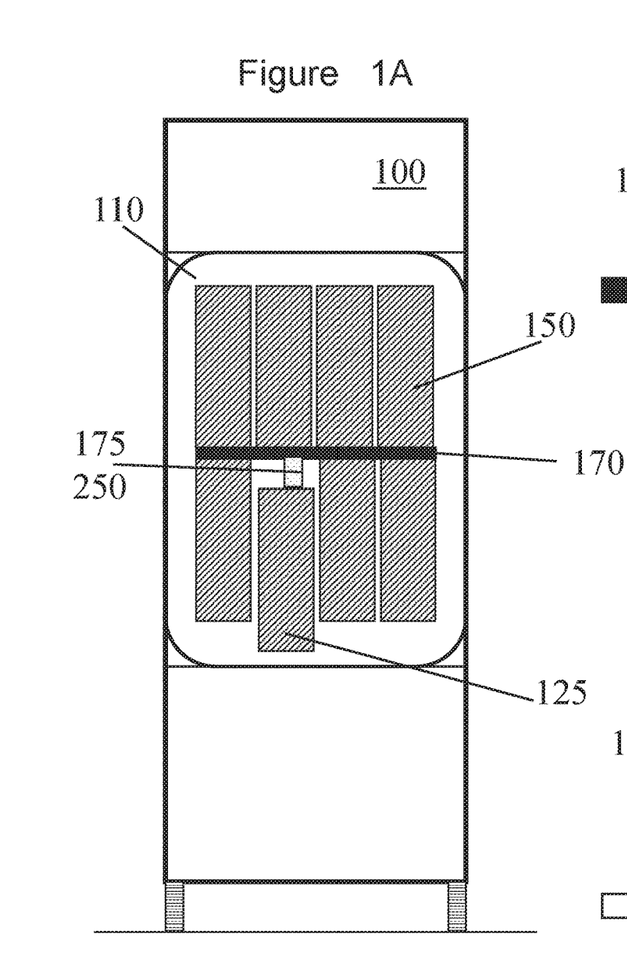
FIG. 1A is a block diagram of a server cabinet/rack assembly having 8 server nodes.
Figure 1B:
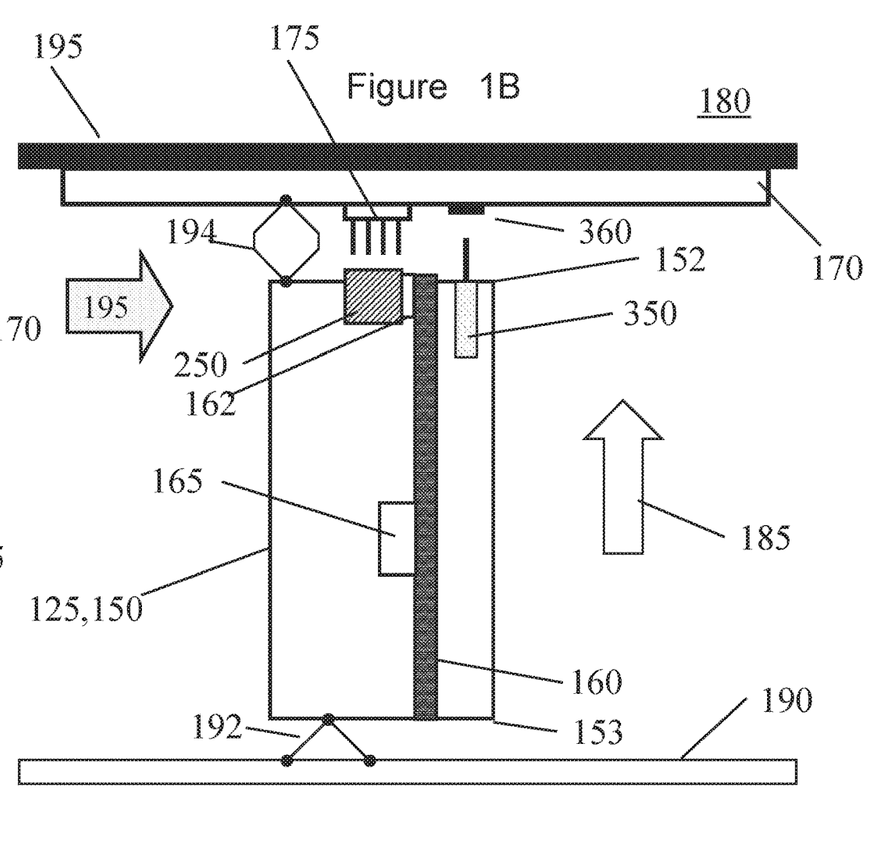
FIG. 1B is a block diagram of an individual server node in the rack assembly positioned to be connected to a mid-plane.

FIG. 1A is a block diagram of an example server cabinet/rack assembly 100 having 8 server nodes 150 and FIG. 1B is a block diagram 180 of an example individual 125 server node of a typically server node 150, in the rack assembly.

As shown in FIG. 1A, the typical server node 150 is connected to a mid-plane 170.

FIG. 1B shows an example 125 server node 150 disconnected from the mid-plane 170 for clarity. The server node 150 has one or more circuit boards 160 typically supporting and connecting one or more central processing units (CPUs) 165, one or more memories 165, and/or one or more devices 165, etc. The server nodes 150 have a connector side 152 on which resides one or more connector receptacles 250 and a back side 153 opposite the connector side 152. The connector receptacles 250 have a plurality of connectors 220 (shown in FIG. 2) and are movable so that can connect and disconnect with a header 175. The header 175 has a plurality of header connectors 275 (shown in FIG. 2) that physically mate with respective connectors 220 when the connector receptacle 250 is pushed toward and into the header 175 along an engagement direction 185 until there is a physical engagement and electrical contact between the respective connectors 220 and header connectors 275. (In this view, the header 175 is shown in cross section with the casing removed so the header connectors 275 are visible.) In like manner, when the connector receptacles 250 move in the engagement direction 185 but away from the header connectors 275, the respective connector 220 and header connectors 275 physically disengage and electrical contact is broken. In some embodiments, there is mounting hardware 162 that provides mechanical and/or electrical connection between the connector receptacle 250 and the circuit board 160 and/or circuitry on the circuit board 160.

In one preferred embodiment, the connector receptacle 250 is a "ventura" made by the Amphenol Corporation of Nashua, N.H. Connector receptacles 250 can be high density, e.g. 178 signals per inch of connector receptacle length, and can deliver data at a rate of 6.25 Gbps (Gigabits per second) or higher.

The server rack assembly 100 also comprises hardware to physically position and support hardware elements within the server rack assembly 100. There is a bottom central processor complex (CEC) plate 190 that supports the physical weight of the server nodes 150 and other hardware. There is a mid-plane support plate 195 that supports the weight of the mid-plane 170 and holds the mid-plane 170 and constant position and alignment. Network Locking Mechanisms (NLM's) 192 provide adjustable support for the node 150 and maintain a force in the engagement direction 185 to maintain contact between the connector receptacle 250 and the header 175. In addition, Node Actuation Mechanisms (NAM's) 194 can provide additional connection and adjustable support by connecting and/or locking the structural components of the mid-plane (170, 195) and the nodes 150.

In one embodiment of the server node 150, two or more proximity sensors, as an example 350, are novelly used to determine incipient failures or degradation of electrical contact between the respective connector 220 and header connectors 275, as described in more detail below. In some preferred embodiments, the proximity sensors are used in conjunction with proximity references 360 which provide an accurate reference point to measure electrical contact between the respective connector 220 and header connectors 275. Proximity sensors may be placed on the connector side 152 and/or the back side 153.

In one preferred embodiment, the proximity sensors 350 are a linear variable differential transformer (LVDT) sensors 350 that measure a changing gap, e.g. between the proximity sensor 350 and the proximity reference 360, continuously, incrementally, and/or progressively for every change in gap. In a preferred embodiment, the gap measurement is made along the engagement direction 185. Other embodiments of the proximity sensors 350 are envisioned. For example, the proximity sensors 350 can be optical gap sensors (e.g. light emitting diodes or laser) or capacitive proximity detectors.

Note that the positioning of the proximity sensor 350 and the proximity reference 360 is shown for illustrative purposes and is not drawn to scale.

In a preferred embodiment, the proximity sensor 350 is an LVDT manufactured by the Keyence Corporation, which has a small size and can achieve about 3.5 micron (um) accuracy over a 5 millimeter working range with careful calibration.

Figure 2:
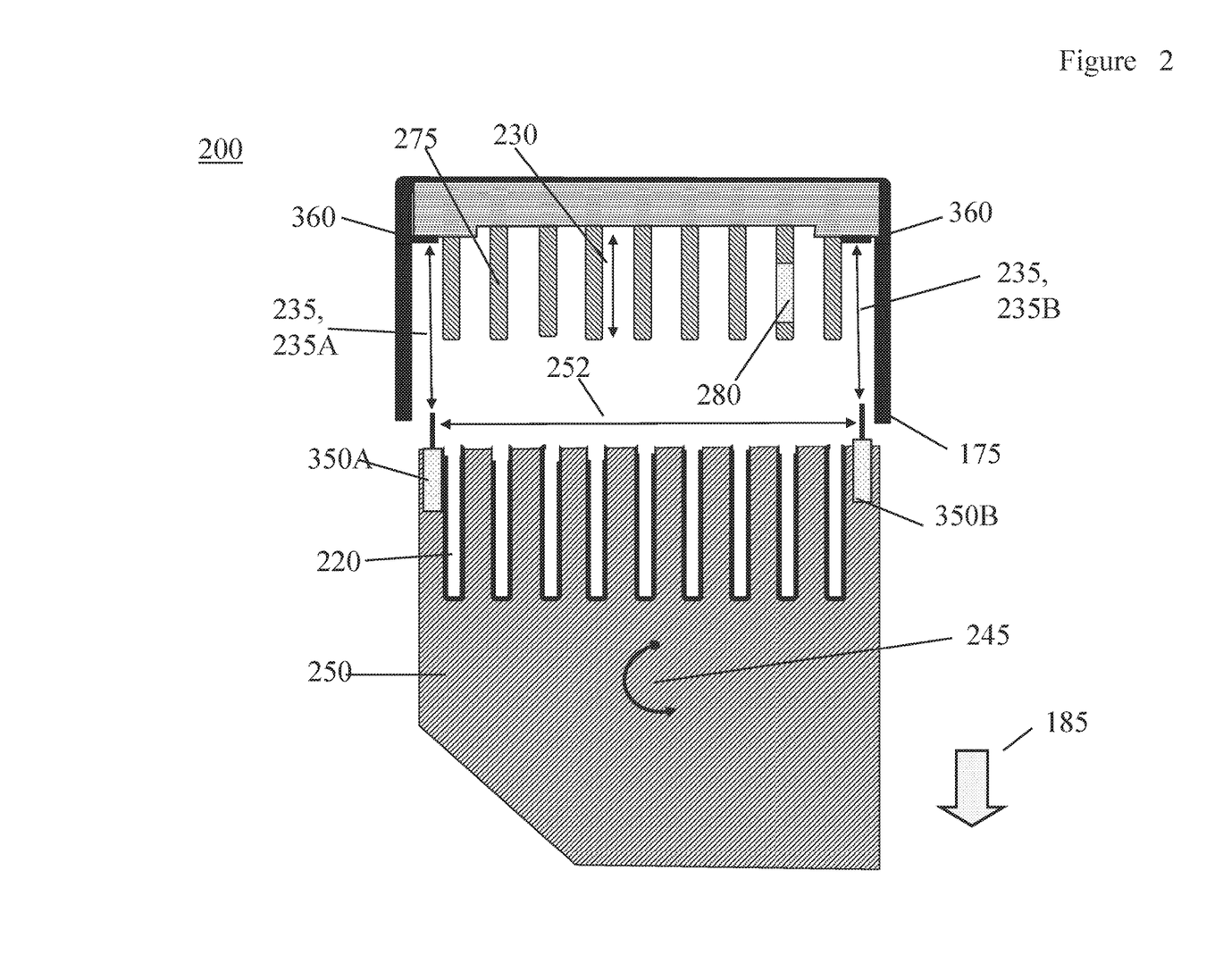
FIG. 2 is a block diagram showing a large, movable pin-count connect (connector receptacle) in proximity to a stationary connection header mounded on the mid-plane.

Arrow 195 shows the viewpoint for FIG. 2.

Referring to FIG. 2, a block diagram 200 showing a large, movable pin-count connect (connector receptacle) 250 in proximity to a stationary connection header 175. The connector receptacle 250 is moving along the engagement direction 185 away from the header 175 breaking the electrical contact between the respective connectors 220 and header connectors 275. (Note that features with the same reference number in different Figures perform the same function and have the same description unless the description is modified in a later Figure.)

The header connectors 275 have a typical length 230 of about 5 mm. However, in some embodiments the length of the header connectors 230 can be smaller, e.g. 2.5 mm, or larger depending on the application.

The wipe distance 280 is the amount of length the header connector 275 is in electrical and physical contact with the respective connector 220. For example, given that the header connectors 275 and connector 220 have a length of 5 mm when there is full insertion, the wipe distance 280 might be smaller because there are obstruction keeping header connector 275 from fully inserting into the connector 220. Also, there could be tolerance difference or corrosion on the contacts to be connected over the full overlap of the insertion. Also, over time, operations, temperature cycles etc. the connectors 220 can move away from header connections 275 vibration, thermal expansion/contraction cycles, etc. causing the wipe distance 280 to decrease.

As the wipe distance 280 decreases performance of the connection degrades. For example, data rates decrease, noise is introduced, etc. In preferred embodiments, gaps are measured to determine whether there are changes in the insertion of the header connections 275 into the connectors 220 that can reduce the wipe distance 280 and cause failure. In preferred embodiments, the gap distance and/or the amount of rotation in one or more directions is used as a proxy for the wipe distance 280. In this way connections in specific locations can be monitored, reported and alarmed in real time.

In a preferred embodiment, the wipe distance 280 or contact wipe length 280 is maintained in the range of 1 to 2.5 mm. In a more preferred embodiment, the contact wipe length is maintained above 100 um (0.1 mm.) Generally, the wipe length 280 is along the direction of the engagement direction 185 and is equal to a full insertion distance (e.g. the length of the contacts) minus the displacements, i.e. $D_{i,k}$ described below, measured by the gaps as described below. For example, for contacts 2.5 mm long, the wipe length would be 2.5 mm displacement (measured by the gaps.) Ideally, the wipe length would be the full 2.5 mm and all the gap measurements would be zero. In preferred embodiments, the displacement of any connector (as determined by the gap measurements) should be less than 100 um.

It should be noted that while this disclosure describes the header connectors 275 as inserting into the connectors 220 on the connector receptacle 250, the roles could be reverse, i.e. there could be insertion connectors 220 on the connector receptacle 250 that insert into the header connectors 275. There could also be a combination of both insertion and receiving connections on both the header connector 275 and the connector receptacle 250. All configurations are contemplated.

FIG. 2 shows an embodiment 200 with 2 proximity sensors 350, a first proximity sensor 350A and a second 350B, separated by a distance 252, e.g. a first distance 252. Each proximity sensor 350 measures a distance, a gap 235 or gap distance 235 and generates and electric signal that represents the respective gap 235. The first proximity sensor 350A measures a first gap 235A and the second proximity sensor 350B measures a second gap 235B. In a preferred embodiment, the gaps 235 are measured continuously in time and space, e.g., over time each proximity sensor puts out a signal that represents the size of the gap at a particular time—the signals are continuous and progressively change in proportion to the change in gap 235.

In a preferred embodiment, the (first) distance 252 is measured across the connectors 220 and/or header connectors 275 and is perpendicular to the engagement direction 185. The distance 252 can be smaller than the distance across the connectors, approximately equal to the distance across the connectors or larger than the distance across the connectors. In any case, by using two sensors not only can the gap be determined, but also an amount of rotation 245 can be determined. In this embodiment 200, the rotation 245 is designated as "roll." In other disclosed embodiments, a second rotation, e.g. "pitch," is introduced. Pitch and roll will be in different angular directions, preferably, but not necessarily orthogonal to one another. In this disclosure pitch and roll will be used to describe particular orientations/ rotations of the contact receptacle 250 with respect to header 175. However, these choices are done for convenience of explanation. The terms can be interchanged/reversed without loss of generality.

In addition, both proximity sensors (350A, 350B) do not have to be mounted on the contact side 152 of the node 150. One or both of the proximity sensors (350A, 350B) can be mounted on the back side 153 of the node. In situations where one proximity sensor 350A is mounted on the contact side 152 and the other proximity sensor, e.g. 350B, is mounted on the back side 153 the distance 252 is the orthogonal distance measured between parallel displacement vectors of the proximity sensors 350, e.g. along the engagement direction 185.

The proximity sensors 350 can be calibrated in different ways. For example, a given signal, configuration, and/or position can be calibrated to represent a full insertion of the header connectors 275 into the connectors 220 on the connector receptacle 250. This might be considered a reference gap 235, e.g. a "zero gap reference," from which all progressive movement, i.e. changes in gap 235, are measured. Other calibrations are contemplated.

If both proximity sensors (e.g. 350A and 350B) see progressive changes in gap 235 of the same amount at the same time, the wipe length for every header connection 275 and connector 220 will progress at the same amount. However, if each proximity sensor 350 sees progressive changes in gap 235 that are different, the wipe length 280 for each set of header connections 275 and connectors 220 will be different because there is both a displacement (e.g. in the engagement direction 185) and a rotational 245 progression/ change. The problem becomes more complicated if there is displacement and/or rotational progression/change a second orientation, e.g. both roll and pitch changes. The present invention can account for all these progressive changes and real time for each of the connection pairs (220, 275.)

Figure 3:
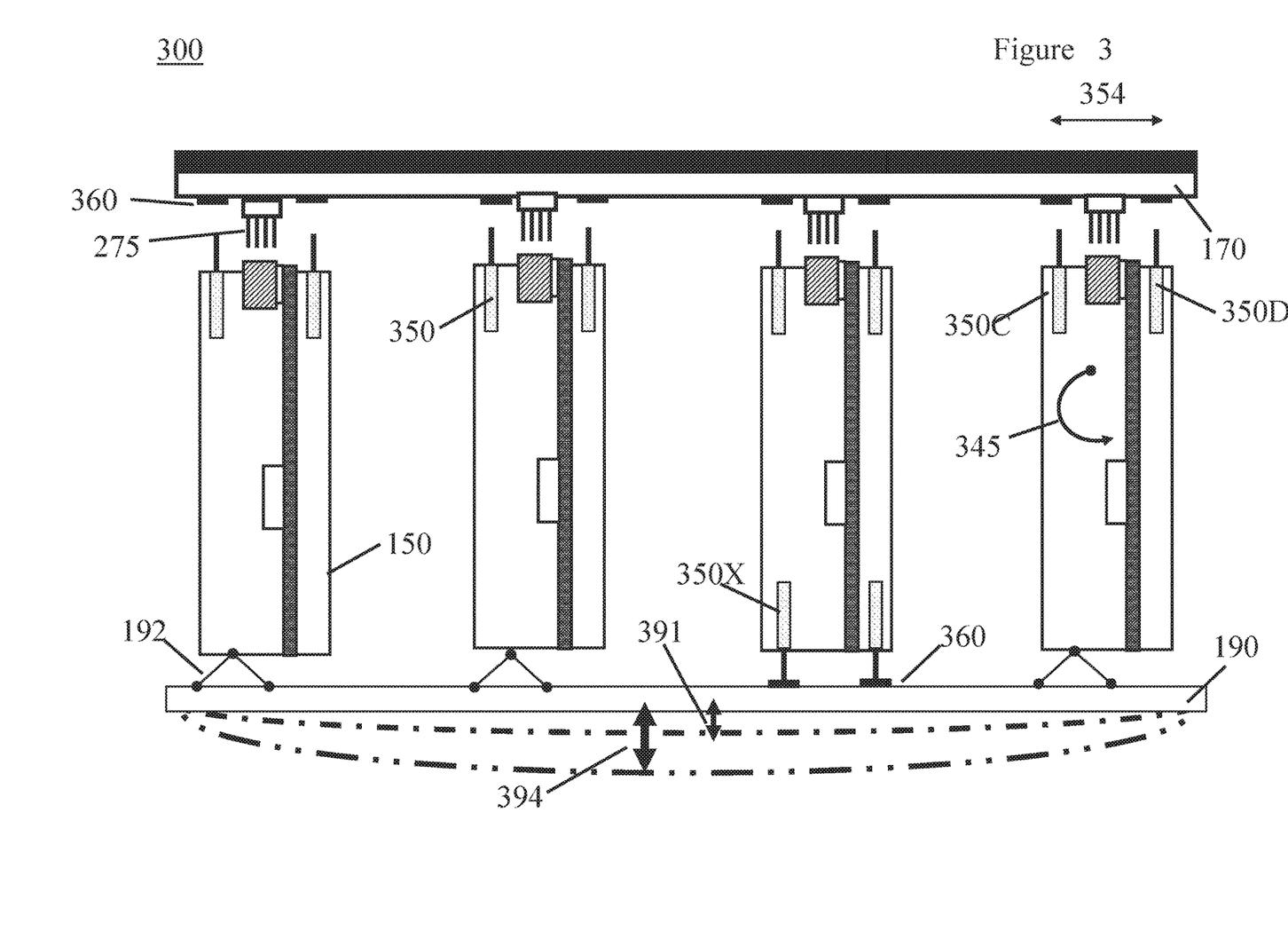
FIG. 3 is a block diagram showing up to four server nodes mounted in the rack assembly in proximity to their respective connection headers on the mid-plane and illustrating the deformation of the bottom of the central processor complex (GEC) or rack assembly plate due to the weight of the server nodes.

FIG. 3 is a block diagram showing up to four server nodes 150 mounted in the server rack assembly (100, 300) with two proximity sensors (350C, 350D) mounted on a different plane than the proximity sensors (350A, 350B) in FIG. 2, and therefore measuring a rotation movement 345 in a different direction than 245 shown in FIG. 2. In this preferred embodiment, the plane of the proximity sensors (350C, 350D) and the direction of rotation 345 is orthogonal to the that of the proximity sensors (350A, 350B) in FIG. 2. The distance 354 between the two proximity sensors (350C, 350D) also spans across the contacts (220, 275) but in a direction orthogonal to direction 252. The rotation 345 shown in FIG. 3 is here referred to as "pitch," but as stated above, different terms can be applied to directions of rotation depending on the frame of reference.

FIG. 3 also shows an alternative way of mounting two proximity sensors (350X.) Rather than having the proximity sensors 350 mounted on the connector side 152 of the node, one or both of the sensors 350X can be mounted on the opposite side or back side 153. In this case the gap is measured on the back side 153 and the actual insertion distance is determine knowing the gap measured from the backside, the length of the node and the distance between the bottom central processor complex 190 and the reference point 360. In this particular node 150, the NLM 192 is removed from the Figure for clarity.

Again, if one proximity sensor, e.g. 350C, is on the contact side 152 and the other proximity sensor, e.g. 350D, is on the back side 153 of the node 150, the distance 354 between the proximity sensors is the orthogonal distance between the vector displacement of the proximity sensors 350, e.g. in the engagement direction 185.

FIG. 3 also shows the effect of the weight of the server nodes 150 upon the bottom central processor complex (CEC) plate 190. As is shown, the more server nodes 150 are assembled in the rack that supports the physical weight of the server nodes 150, the more the CEC plate 190 deflects (391, 394.) Deflection 391 illustrates the deflection 391 with one server node 150 weighing on the CEC plate. Deflection 394 illustrates the deflection 394 with four server nodes 150 weighing on the CEC plate. The deflections (391, 394) cause each of the nodes to move in the engagement direction 185 and rotate (245, 345) at different amounts so each connection pair (220, 275) loses a different amount of wipe length 280, e.g. insertion distance. Thus, the effects of the deflections (391, 394) are experience differently by each connection pair (220, 275) and change over time, operation, and temperature cycle.

It is noted that with 4 proximity sensors (350A, B, C, and D) the gap signals can be used to determine wipe length 280 changes (losses) for each connection pair (220, 275) using displacement and rotation of each server node in two directions. Alternative embodiments can use just 2 proximity sensors to determine on direction of displacement and rotation. In other preferred embodiments, a single proximity sensor can determine the gap signal at one end of the separation distance for each of the directions. In this embodiment, only 3 proximity sensors 350 are need because one gap signal is common to both of the selected (e.g. orthogonal) directions.

Figure 4A:
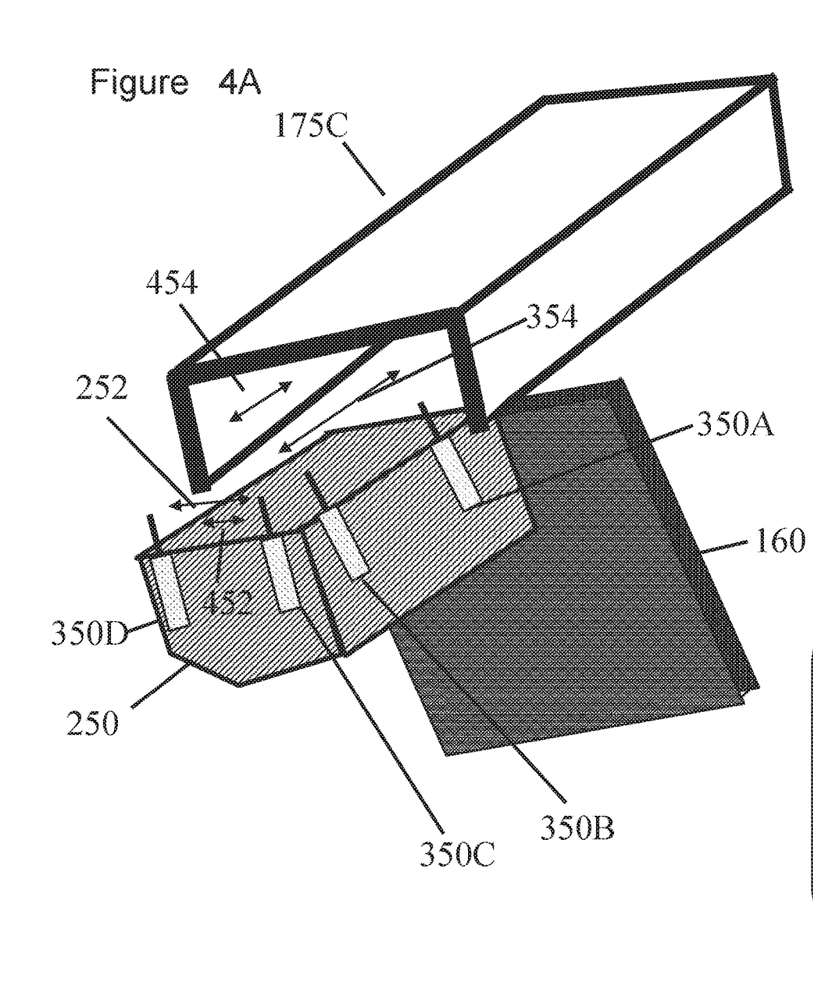
FIG. 4A is an isometric diagram showing relative orientations of an example connector receptacle and connection header casing.
Figure 4B:
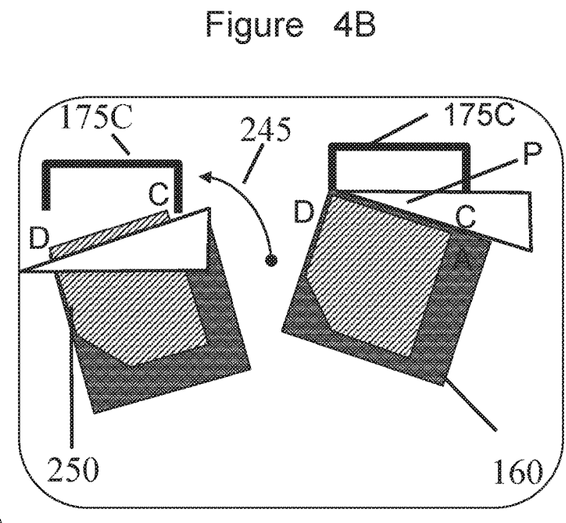
FIG. 4B is a diagram showing a relative rotation in a first direction, e.g. roll.
Figure 4C:
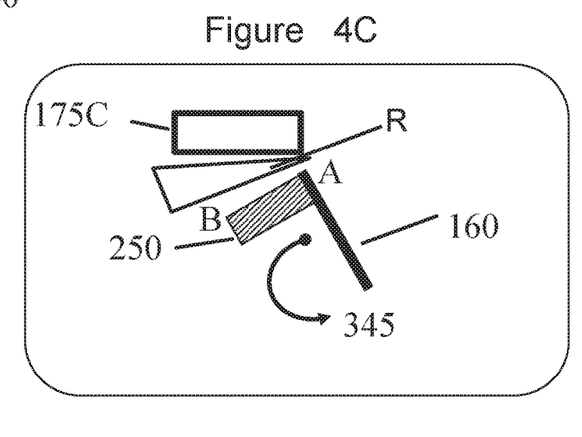
FIG. 4C is a diagram showing a relative rotation in a second direction, e.g. pitch.

FIG. 4A is an isometric diagram showing relative orientations of an example connector receptacle 250 and connection header casing 175C; FIG. 4B shows a relative rotation in a first direction, e.g. roll; and FIG. 4C shows a relative rotation in a second direction, e.g. pitch.

For clarity the head connections 275 are not shown in FIG. 4A. Only the header casing 175C of the header 175 is shown as an orientation reference for the connector receptacle 250. The connector receptacle 250 has for proximity sensors, 350A, B, C, and D respectively. The circuit board 160 is attached to the connector receptacle 250 as described above.

Proximity sensors 350A and 350B are separated by a distance 354 and positioned so their gap signals will measure pitch orientation 345 in this non-limiting example. Proximity sensors 350C and 350D are separated by a distance 452 and positioned so their gap signals will measure roll orientation 345 in this non-limiting example. Distance 454 is a displacement measurement (see distance k in FIG. 5) from one of the proximity sensors (350A, 350B) to an arbitrary connection pair (220, 275) in the direction from one of the proximity sensors to the other. Distance 452 is a displacement measurement (see distance i in FIG. 5) from one of the proximity sensors (350C, 350D) to the same arbitrary connection pair (220, 275) in the direction from one of the proximity sensors to the other.

FIG. 4B shows the orientation measured by proximity sensors 350C and 350D, e.g. roll 245. The sensors 350C and 350D are designated as "C" and "D" respectively for clarity.

FIG. 4B shows the roll angle "R" can have a positive or negative angular direction depending on which of the gap measurements/signals of proximity sensor (C or D) is larger. (The hypotenuse and longer leg of the right triangle defining roll angle R are the orientation of the connector receptacle 250 with respect to the header 175 before and after the rotation, respectively.)

FIG. 4C shows the orientation measured by proximity sensors 350A and 350B, e.g. pitch 345. The sensors 350A and 350B are designated as "A" and "B" respectively for clarity. FIG. 4C shows the pitch angle "P" in a single direction of rotation. However, pitch angle P can have a positive or negative angular direction depending on which of the gap measurements/signals of proximity sensor (A or B) is larger. (The hypotenuse and longer leg of the right triangle defining pitch angle P are the orientation of the connector receptacle 250 with respect to the header 175 before and after the rotation, respectively.)

Figure 5:
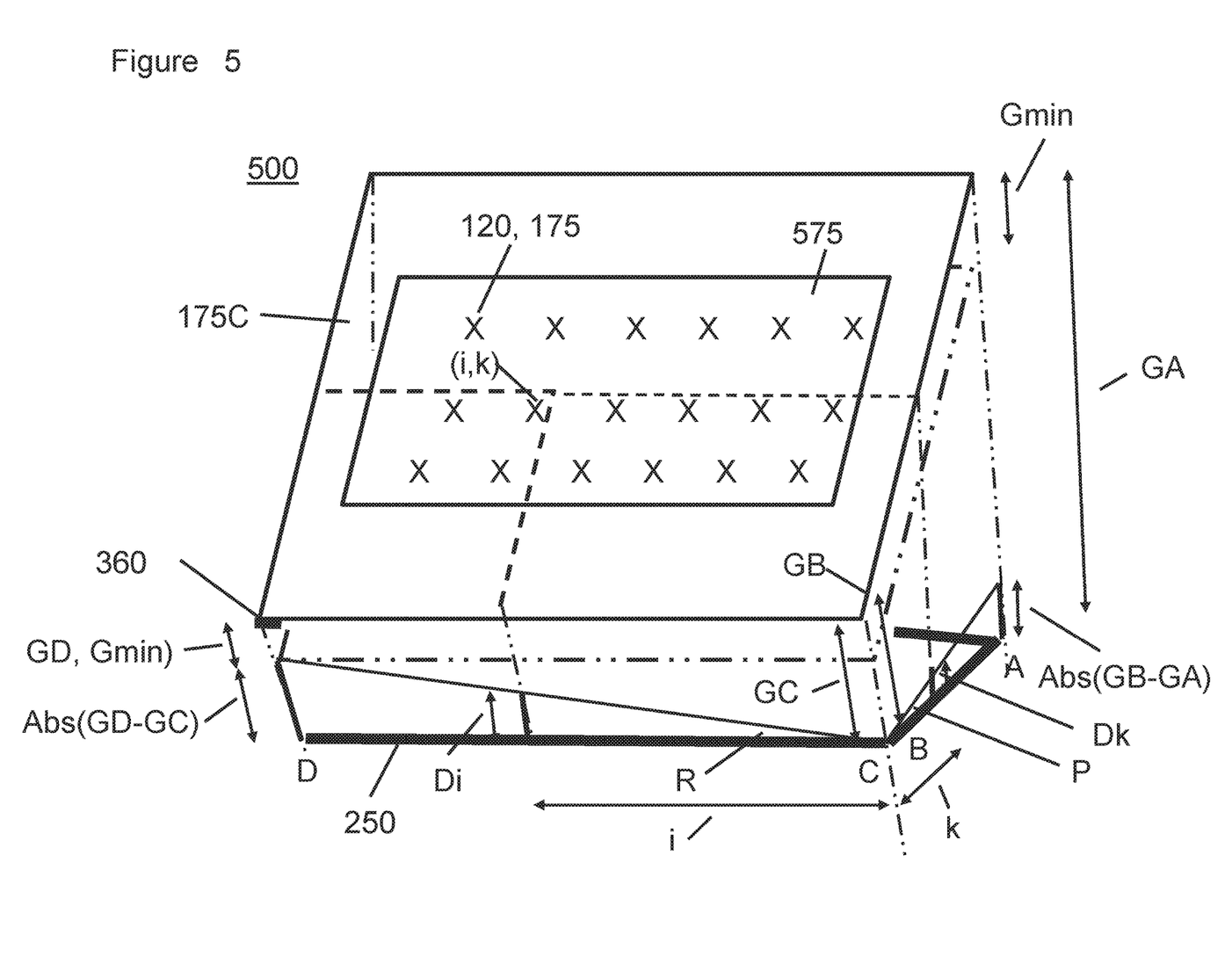
FIG. 5 is an isometric diagram showing an example of using the proximity sensor gap measurements to determine an amount of linear separation/displacement of a connection pair, e.g. due to deformation in the rack assembly.

FIG. 5 is an isometric diagram showing an example of using the proximity sensor gap measurements to determine an entire amount of linear separation/displacement, Di,k of an arbitrary connection pair (220, 275), e.g. due to deformation in the rack assembly.

The direction of view is looking through the back of the header casing 175C so the connection pairs (220, 275), represented by "X's" are visible as an array 575 of connection pairs (220, 275.) An arbitrary connection pair (220, 275) is designated as "(i,k) in the array 572. The distances "i" and "k" are perpendicular displacements from the direction of the distance between a respective pair of proximity sensors 360, as described below, that can uniquely locate the position of the arbitrary connection pair (220, 275.)

GA, GB, GC, and GD are the gap distances measured by proximity detectors 350A (or A), 350B (or B), 350C (or C), and 350D (or D), respectively, from the proximity sensor 350 at its location on the connector receptacle 250 to the associated proximity reference 360 (typically.)

In one preferred embodiment, the smallest gap distance, Gmin, in this example GD, can be viewed as the same displacement component all the connection pairs (220, 275) undergo in the engagement direction 185. The additional components of displacement each connection pair (220, 275) undergoes in the engagement direction 185 will depend on the two directions of rotation, e.g. pitch and roll, of the connector receptacle 250 with respect to the header 175. In this embodiment, the total displacement of an arbitrary connection pair (i, k) will equal Di,k where $$Di,k = Gmin + Di + Dk$$

Where:

Di,k is the total displacement of an connection with respect to a header connection in an arbitrary connection pair (i, k) in the direction of engagement 185

Gmin=the minimum gap measurement of all the four (or three) proximity sensors 350

Di=the displacement in the direction of engagement 185 due to one rotational direction, e.g. roll, of the connection receptacle 250

Dk=the displacement in the direction of engagement 185 due to another rotational direction, e.g. pitch, of the connection receptacle 250.

In a preferred embodiment, Di,k, the total displacement from "zero gap" measures for each connection pair (i, k) should be below 100 um.

For the non-limiting example configuration 500 shown in FIG. 5, by similar triangles $$Di = i * \text{Abs}(GD-GC)/CD$$

$$Dk = k * \text{Abs}(GB-BA)/AB$$

Where:

GA is the gap distance measured by proximity sensor 350A

GB is the gap distance measured by proximity sensor 350B

GC is the gap distance measured by proximity sensor 350C

GD is the gap distance measured by proximity sensor 350D

AB is the distance between proximity sensor 350A and 350B

CD is the distance between proximity sensor 350C and 350D

Note that in a system using three proximity sensors 350 instead of four, proximity sensor 350B and 350C can be the same.

Alternatively, using trigonometry, where:

$$\text{Angle } R = \arctan(\text{Abs}(GD-GC)/CD) \text{ and}$$

$$\text{Angle } P = \arctan(\text{Abs}(GB-GA)/AB)$$

$$Di = i * \tan R$$

$$Dk = k * \tan P$$

In this non-limiting configuration, the projected distance i and k are measured from the vertexes of the Angle R and Angle P, respectively.

Figure 6:
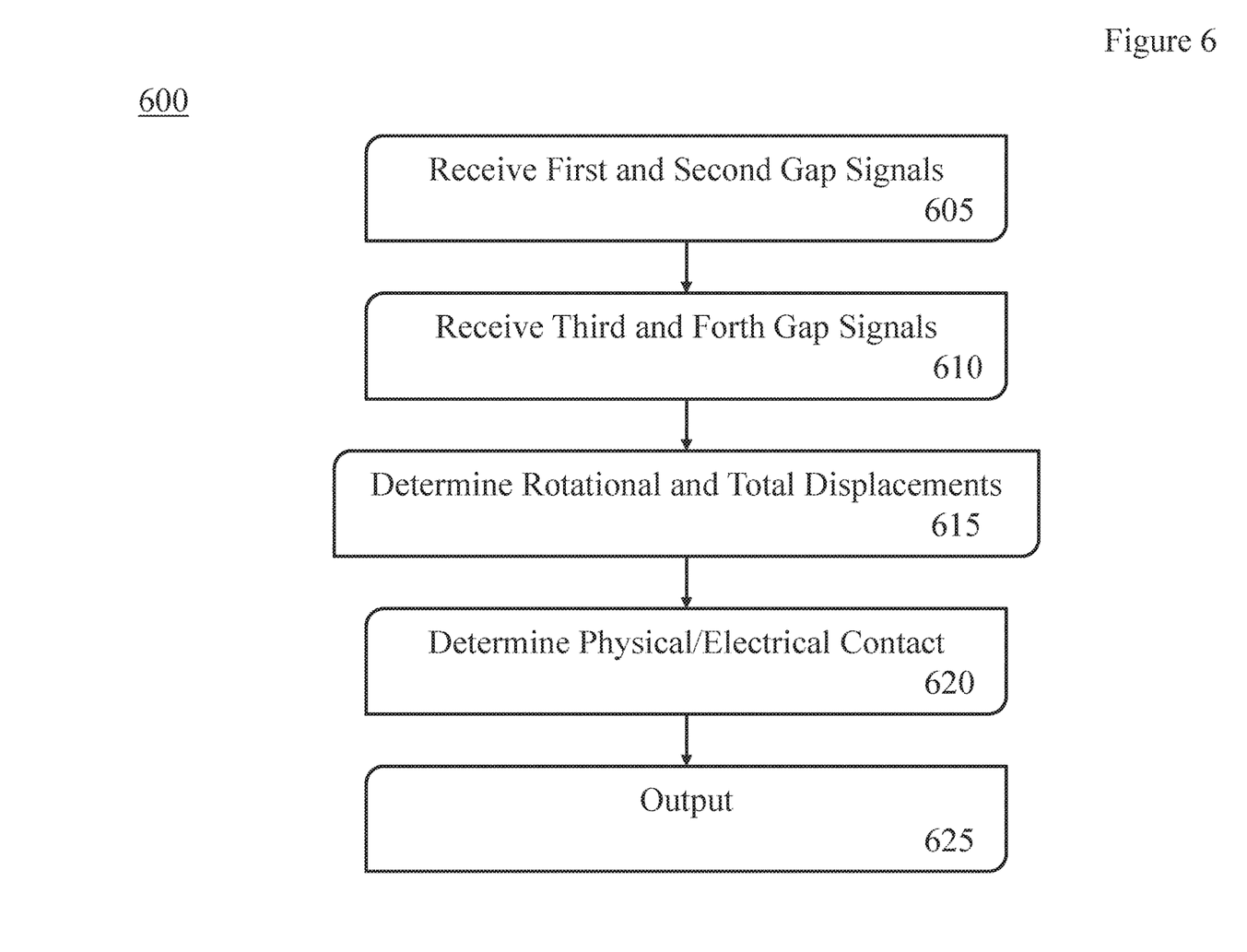
FIG. 6 is a flow chart showing the steps performed by one preferred server node connection detection system.

FIG. 6 is a flow chart of a process 600 showing the steps performed by one preferred server node connection detection system.

In step 605, the system 700 (in FIG. 7) receives a gap signal from each of a pair of proximity sensors 350. The proximity sensors in the pair are those that can measure a particular orientation. In the non-limiting example of FIG. 5, proximity sensors 350A and 350B are determining pitch 345 and proximity sensors 350C and 350D are determining roll 245. In one preferred embodiment, only two proximity sensors might be used, e.g. if only one orientation is chosen as an adequate measurement. For example, either the pitch or roll proximity sensors 350 are used, and step 610 would not be performed.

In step 610, the system 700 receives gap signals from the pair of proximity sensors that were not access in step 605. In three sensor systems only one addition gap signal needs to be received in this step 610. For example, if gap signals representing gaps GA and GB were received in step 605, then only gap signals for gap GD needs to be received since GB represents both the GB and GC gaps.

In step 615, Gmin, Di, Dk, and Di,k are determined as explained above. (In two sensor systems 700, only Di or Dk are determined.)

In one embodiment of step 620, the total displacement Di,k each connection pair (220, 275) undergoes in the engagement direction 185 at each location (i,k) is monitored and outputted 625.

In another embodiment of step 620, the Di,k is compared to a threshold value, e.g. 100 um. If the Di,k is above the threshold, a notification/alarm is sent to the user.

In another embodiment of step 620, a Gmax value is determined. Gmax is the maximum gap measured by any one of the proximity sensors 350. In this embodiment, Gmax is compared to a threshold, e.g 100 um, and if Gmax exceeds the threshold, a notification/alarm is sent to the user. In addition, Gmax can be continuously monitored and/or trended.

In another embodiment of step 620, Di, e.g. roll, is compared to a threshold, e.g. 100 um, and if Di exceeds the threshold, a notification/alarm is sent to the user. In addition, Di can be continuously monitored and/or trended.

In another embodiment of step 620, Dk, e.g. pitch, is compared to a threshold, e.g. 100 um, and if Dk exceeds the threshold, a notification/alarm is sent to the user. In addition, Di can be continuously monitored and/or trended.

Other embodiments are envisioned.

Figure 7:
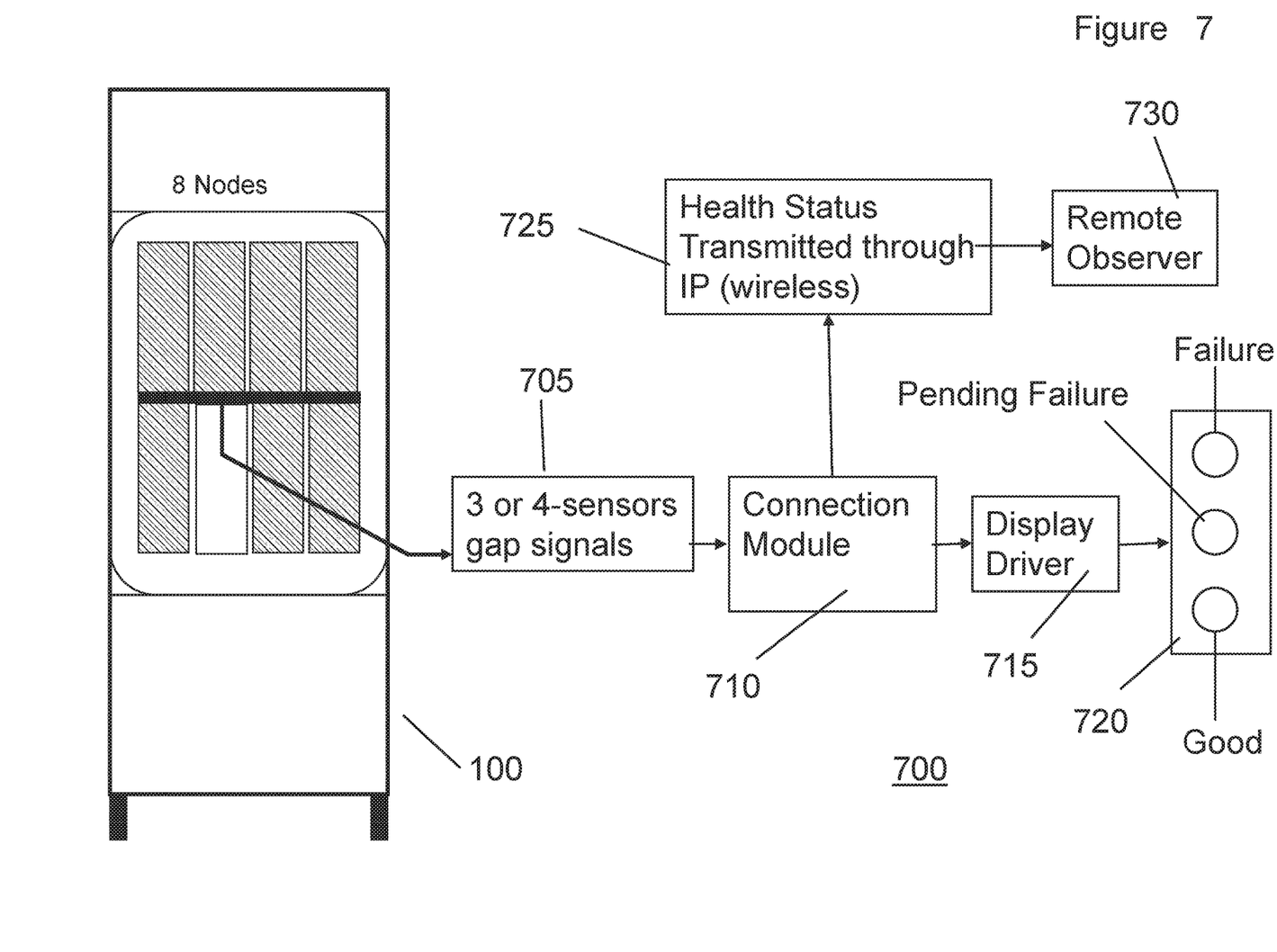
FIG. 7 is a block diagram of an example server node connection detection system, including a connection module, which produces wipe length monitoring signals and alarms when wipe length is out of tolerance.

FIG. 7 is a block diagram of an example server node connection detection system 700, including a connection module 710, which produces wipe length monitoring signals and alarms 720 when wipe length is out of tolerance.

The connection module 710 receives the gap signals through an interface 705 with the proximity sensors 350. The connection module 710 determines the total displacement, Di,k, of n connection with respect to a header connection in any arbitrary connection pair (i, k) in the direction of engagement 185 as described above. (Other measurements as discussed above are contemplated as well as Di,k.) The connection module 710 can be on board the server node 150, in the rack assembly 100 or in any remote location.

The connection module 710 can send signals representing the real time displacement that each connection pair (220, 275) undergoes in the engagement direction 185. This in-situ measurement can be sent through a display driver 715 to give a user a real time monitoring signal. The connection module can set alarm limits to indicate if each of the connection pairs (220, 275) is with in functional parameters (e.g. good), close to pending failure, or failed (beyond the threshold.) The connection module would be able to provide a real time signal, a trend, progressive movements, and pending or failure status for each connection pair (220, 275) and offer guidance on what adjustments to make to bring the server node back in compliant swipe loss. This information can also be provided through a wireless connection and/or network 725 to a remote 730 monitoring station/user.

In one preferred embodiment of FIG. 7 the output can give an indication to a maintenance personnel at the time of mounting in the server rack whether or not the gaps, pitch, and roll of the server node is within specification. This can provide visual/auditory feedback that adjustments are needed during installation. Alternatively, wireless transmissions from the invention to a remote observer or operator, e.g. in a large data center would indicate that the connections were degrading over time and would provide insight about when to provide preventive maintenance.

The descriptions of the various embodiments of the present invention are presented for purposes of illustration and/or example but are not intended to be exhaustive or limited to the embodiments disclosed. Given this disclosure, many modifications and variations will be apparent to those of ordinary skill in the art without departing from the scope and spirit of the described embodiments. The Figures and their description are conceptual, not to scale, and not meant to be used as formal construction drawings. The terminology used herein is explanatory, chosen to explain the principles of the embodiments and does not limit the concepts and reduction to practice of the invention to systems, components, and processes described by other terms. The invention in part or in entirety is envisioned to be used at the component, system, subsystem and any other product or process level. Alternative practical applications, implementations, or technical improvements of the invention are envisioned and are within the scope of the description.

We claim:

1. A method for determining physical and electrical contact integrity between a server node connector receptacle on at least one server node in a server system and a respective connection header on a midplane of the server system, comprising the steps of:
   receiving a first gap signal representing a first gap distance between the server node connector receptacle and the connection header;
   receiving a second gap signal representing a second gap distance between the server node connector receptacle and the connection header, the first and second gap distances separated by a first distance, the first distance having a first direction;
   determining a first angle between the first direction and an engagement direction; and
   using the first angle and first and second gap distance to determine whether one or more connectors in the server node connector receptacle has a physical and electrical contact with an opposing connector in the connection header along a wipe length with a displacement less than a tolerance,
   wherein an alarm is sent to a user when the displacement exceeds the tolerance.

2. A method, as in claim 1, where a contact information is outputted to the user.

3. A method, as in claim 1, further comprising the steps of:
   receiving a third gap signal representing a third gap distance between the at least one server node connector receptacle and the connection header, the second and third gap distances separated by a second distance, the second distance having a second direction;
   determining a second angle between the second direction and the engagement direction; and
   using the second angle and second and third gap distance to determine when the displacement exceeds the tolerance.

4. A method, as in claim 3, where both the first angle and the first and second gap distances and the second angle and the second and third gap distances are used to determine whether one or more connectors in the server node connector receptacle has the displacement exceeding the tolerance.

5. The method, as in claim 1, where the first gap signal and the second gap signal are created by a first proximity sensor and a second proximity sensor, respective.

6. The method, as in claim 5, where the one or more of the first proximity sensor and the second proximity sensor is on a connection header side of the at least one server node.

7. The method, as in claim 5, where the one or more of the first proximity sensor and the second proximity sensor is on a back side of the at least one server node.

8. The method, as in claim 1, where one or more of a first proximity sensor and a second proximity sensor is calibrated to represent a full insertion of the connection header along the wipe length.

9. The method, as in claim 1, where the first gap signal and the second gap signal are measured over a time.

10. The method, as in claim 9, where if the first gap distance and the second gap distance change a same amount in the time indicating that the wipe length for all the connectors change the same amount.

11. The method, as in claim 9, where the first gap distance and the second gap distance change a different amount in the time indicating that the wipe length for one or more of the connectors change differently.

12. The method, as in claim 11, where a first rotation of the server node is indicated when the first gap distance and the second gap distance change a different amount.

13. The method, as in claim 3, where a first difference between the first gap distance and the second gap distance indicates a first rotation of the at least one server node and a second difference between the second gap distance and the third gap distance indicates a second rotation of the at least one server node.

14. The method, as in claim 13, where the first rotation and the second rotation are orthogonal.

15. The method, as in claim 3, where the connectors are arranged in an array.

16. The method, as in claim 3, that determines a deformation of a rack assembly in the server system by a difference in wipe length of the connectors of two or more server nodes.

17. The method, as in claim 3, where the tolerance is 100 micrometers (um) or less.

18. The method, as in claim 1, where one or more data about the displacement is used to provide a user with one or more of the following outputs: a real time monitoring signal, a failure indication, a pending failure indication, a trend, a progressive movement indication, and a guidance about adjustments.

19. The method, as in claim 18, where the data is used to align the server nodes.

* * * * *